(12) United States Patent
Li et al.

(10) Patent No.: US 11,950,464 B2
(45) Date of Patent: Apr. 2, 2024

(54) DISPLAY PANEL AND ELECTRONIC DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Gen Li, Beijing (CN); Huijuan Yang, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 461 days.

(21) Appl. No.: 17/280,656

(22) PCT Filed: Jul. 31, 2020

(86) PCT No.: PCT/CN2020/106305
§ 371 (c)(1),
(2) Date: Mar. 26, 2021

(87) PCT Pub. No.: WO2021/031829
PCT Pub. Date: Feb. 25, 2021

(65) Prior Publication Data
US 2021/0384279 A1    Dec. 9, 2021

(30) Foreign Application Priority Data
Aug. 19, 2019 (CN) .......................... 201910766543.7

(51) Int. Cl.
*H10K 59/121*   (2023.01)
*H10K 59/131*   (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............. H10K 59/131; H10K 59/1213; H10K 59/1216; H10K 59/12; H10K 59/123
See application file for complete search history.

(56) References Cited

U.S. PATENT DOCUMENTS 9,647,049 B2   5/2017   Wu et al.
10,748,978 B2  8/2020   Lim
(Continued)

FOREIGN PATENT DOCUMENTS

CN   103915431 A   7/2014
CN   104576708 A   4/2015
(Continued)

OTHER PUBLICATIONS

First Chinese Office Action dated Apr. 20, 2021, received for corresponding Chinese Application No. 201910766543.7, 25 pages.

*Primary Examiner* — Farun Lu
*Assistant Examiner* — Sandra Milena Rodriguez Villanu
(74) *Attorney, Agent, or Firm* — Kinney & Lange, P.A.

(57) ABSTRACT

A display panel includes: a substrate, a display area and a notch area on the substrate, and a capacitance compensation area. The display area at least partially surrounds the notch area, and the capacitance compensation area is located on a side of the display area facing the notch area. The capacitance compensation area includes a plurality of capacitance compensation units, and each capacitance compensation unit of at least some of the plurality of capacitance compensation units includes: a first conductive layer, a second conductive layer, and a first insulating layer between the first conductive layer and the second conductive layer. The first conductive layer is electrically connected to one of a plurality of gate lines, and an orthographic projection of the second conduc- (Continued)

tive layer on the substrate at least partially overlaps with an orthographic projection of the first conductive layer on the substrate.

14 Claims, 10 Drawing Sheets

(56) References Cited

U.S. PATENT DOCUMENTS

| | | | |
|---|---|---|---|
| 10,964,761 | B2 | 3/2021 | Lee et al. |
| 2004/0046164 | A1 | 3/2004 | Kobayashi et al. |
| 2006/0061293 | A1 | 3/2006 | Kobayashi et al. |
| 2016/0307983 | A1 | 10/2016 | Wu et al. |
| 2019/0131360 | A1 | 5/2019 | Lee et al. |
| 2019/0181213 | A1 | 6/2019 | Lim |
| 2020/0006457 | A1* | 1/2020 | Gu .................. H10K 59/353 |
| 2020/0194461 | A1* | 6/2020 | Park .................. G09G 3/20 |

FOREIGN PATENT DOCUMENTS

| | | | |
|---|---|---|---|
| CN | 107785399 | A | 3/2018 |
| CN | 108010951 | A | 5/2018 |
| CN | 108538907 | A | 9/2018 |
| CN | 109116644 | A | 1/2019 |
| CN | 109449167 | A | 3/2019 |
| CN | 109727997 | A | 5/2019 |
| CN | 110010622 | A | 7/2019 |
| CN | 110459572 | A | 11/2019 |
| IN | 107481669 | A | 12/2017 |
| JP | 2003255856 | A | 9/2003 |

\* cited by examiner

DISPLAY PANEL AND ELECTRONIC DEVICE

CROSS-REFERENCE TO RELATED APPLICATION

The present disclosure is a Section 371 National Stage Application of International Application No. PCT/CN2020/106305, filed on Jul. 31, 2020, entitled "DISPLAY PANEL, AND ELECTRONIC DEVICE", which claims priority to Chinese Application No. 201910766543.7, filed on Aug. 19, 2019, incorporated herein by reference in their entirety.

TECHNICAL FIELD

The present disclosure relates to a field of display, and in particular to a display panel and an electronic device.

BACKGROUND

With a rapid development of organic light-emitting diode display panels, consumers have increasingly higher requirements for appearances of display devices. Many display panels have changed from a traditional square to a now popular special-shaped structure, such as a rounded corner of a display area, a special-shaped groove in the display area, etc. The special-shaped structure is undoubtedly a challenge for manufacturers. For example, with a development of full screens, special-shaped full screens with notch designs (such as "bangs" screens) are increasingly adopted by mobile phone manufacturers. The special-shaped full screen is conducive to obtaining a higher screen-to-body ratio, and the notch design in display can reserve design space for components such as a front camera. However, the notch design will cause pixel gate electrodes on different sides of the notch to be different from normal pixel gate electrodes, which may cause a problem of uneven brightness.

SUMMARY

The embodiments of the present disclosure provide a display panel, including: a substrate; a display area and a notch area on the substrate, wherein the display area at least partially surrounds the notch area; and a capacitance compensation area, wherein the capacitance compensation area is located on a side of the display area facing the notch area, wherein the capacitance compensation area includes a plurality of capacitance compensation units, and each capacitance compensation unit of at least some of the plurality of capacitance compensation units includes: a first conductive layer, wherein the first conductive layer is electrically connected to one of a plurality of gate lines; a second conductive layer, wherein an orthographic projection of the second conductive layer on the substrate at least partially overlaps with an orthographic projection of the first conductive layer on the substrate; and a first insulating layer between the first conductive layer and the second conductive layer, wherein the first insulating layer is configured to electrically insulate the first conductive layer and the second conductive layer.

In some embodiments, the display area includes: a first display sub-area and a second display sub-area respectively being located on different sides of the notch area, wherein the plurality of gate lines extend from the first display sub-area through the capacitance compensation area to the second display sub-area.

In some embodiments, the first conductive layer and the second conductive layer are separated by the first insulating layer.

In some embodiments, a thin film transistor is arranged in the display area, and the thin film transistor includes a gate electrode; the display area includes: a third conductive layer, wherein the third conductive layer is configured to form the gate electrode of the thin film transistor; and a fourth conductive layer, wherein an orthographic projection of the fourth conductive layer on the substrate and an orthographic projection of the third conductive layer on the substrate at least partially overlap to form a capacitor, wherein one of the first conductive layer and the second conductive layer is provided in a layer same as a layer where the third conductive layer is provided, and another of the first conductive layer and the second conductive layer is provided in a layer same as a layer where the fourth conductive layer is provided.

In some embodiments, the second conductive layer is located on a side of the first conductive layer away from the substrate, and each capacitance compensation unit further includes: a second insulating layer, wherein the second insulating layer is located on a side of the second conductive layer away from the first conductive layer; and a fifth conductive layer, wherein the fifth conductive layer is located on a side of the second insulating layer away from the first conductive layer.

In some embodiments, a first via-hole structure is provided in the second insulating layer, and the fifth conductive layer is electrically connected to the second conductive layer through the first via-hole structure.

In some embodiments, each capacitance compensation unit further includes: a third insulating layer, wherein the third insulating layer is located on a side of the fifth conductive layer away from the substrate; and a first electrode layer, wherein the first electrode layer is located on a side of the third insulating layer away from the substrate, and the first electrode layer is electrically connected to a DC signal; wherein a second via-hole structure is provided in the third insulating layer, and the first electrode layer is electrically connected to the fifth conductive layer through the second via-hole structure.

In some embodiments, in the same capacitance compensation unit, both the first conductive layer and the second conductive layer have a rectangular pattern.

In some embodiments, the first conductive layer is located on a side of the second conductive layer away from the substrate, and each capacitance compensation unit further includes: the second insulating layer, wherein the second insulating layer is located on a side of the first conductive layer away from the second conductive layer; and the fifth conductive layer, wherein the fifth conductive layer is located on a side of the second insulating layer away from the first conductive layer.

In some embodiments, a third via-hole structure passing through the first insulating layer and the second insulating layer is provided in the capacitance compensation area, the fifth conductive layer is electrically connected to the second conductive layer through the third via-hole structure, and the third via-hole structure is electrically insulated from the first conductive layer.

In some embodiments, each capacitance compensation unit further includes: the third insulating layer, wherein the third insulating layer is located on a side of the fifth conductive layer away from the substrate; and the first electrode layer, wherein the first electrode layer is located on a side of the third insulating layer away from the substrate, and the first electrode layer is electrically connected to a DC signal, wherein a second via-hole structure is provided in the third insulating layer, and the first electrode layer is electrically connected to the fifth conductive layer through the second via-hole structure.

In some embodiments of the same capacitance compensation unit, the second conductive layer has a rectangular pattern, and the first conductive layer has a rectangular pattern or a ring pattern.

In some embodiments, in the same capacitance compensation unit, an area of the first conductive layer is larger than an area of the second conductive layer, and an orthographic projection of the first conductive layer on the substrate completely covers an orthographic projection of the second conductive layer on the substrate.

In some embodiments, in the same capacitance compensation unit, the area of the first conductive layer is smaller than the area of the second conductive layer, and the orthographic projection of the second conductive layer on the substrate completely covers the orthographic projection of the first conductive layer on the substrate.

In some embodiments, the plurality of capacitance compensation units includes: a first capacitance compensation unit and a second capacitance compensation unit connected to a first gate line; and a third capacitance compensation unit and a fourth capacitance compensation unit connected to a second gate line, wherein the first gate line and the second gate line are adjacent to each other, and at least a part of the first gate line in the capacitance compensation area and at least a part of the second gate line in the capacitance compensation area are respectively provided in different layers.

In some embodiments, at least a part of the first gate line in the capacitance compensation area and the first conductive layer are provided in the same layer, and at least a part of the second gate line in the capacitance compensation area and the second conductive layer are provided in the same layer.

The embodiments of the present disclosure also provide an electronic device, including the display panel as described in any one of the foregoing embodiments.

BRIEF DESCRIPTION OF THE DRAWINGS

In order to make technical solutions of the embodiments of the present disclosure clearer, drawings of the embodiments will be briefly described. It should be understood that the drawings described below only relate to some embodiments of the present disclosure, rather than limit the present disclosure, wherein.

DETAILED DESCRIPTION OF EMBODIMENTS

Figure 1:
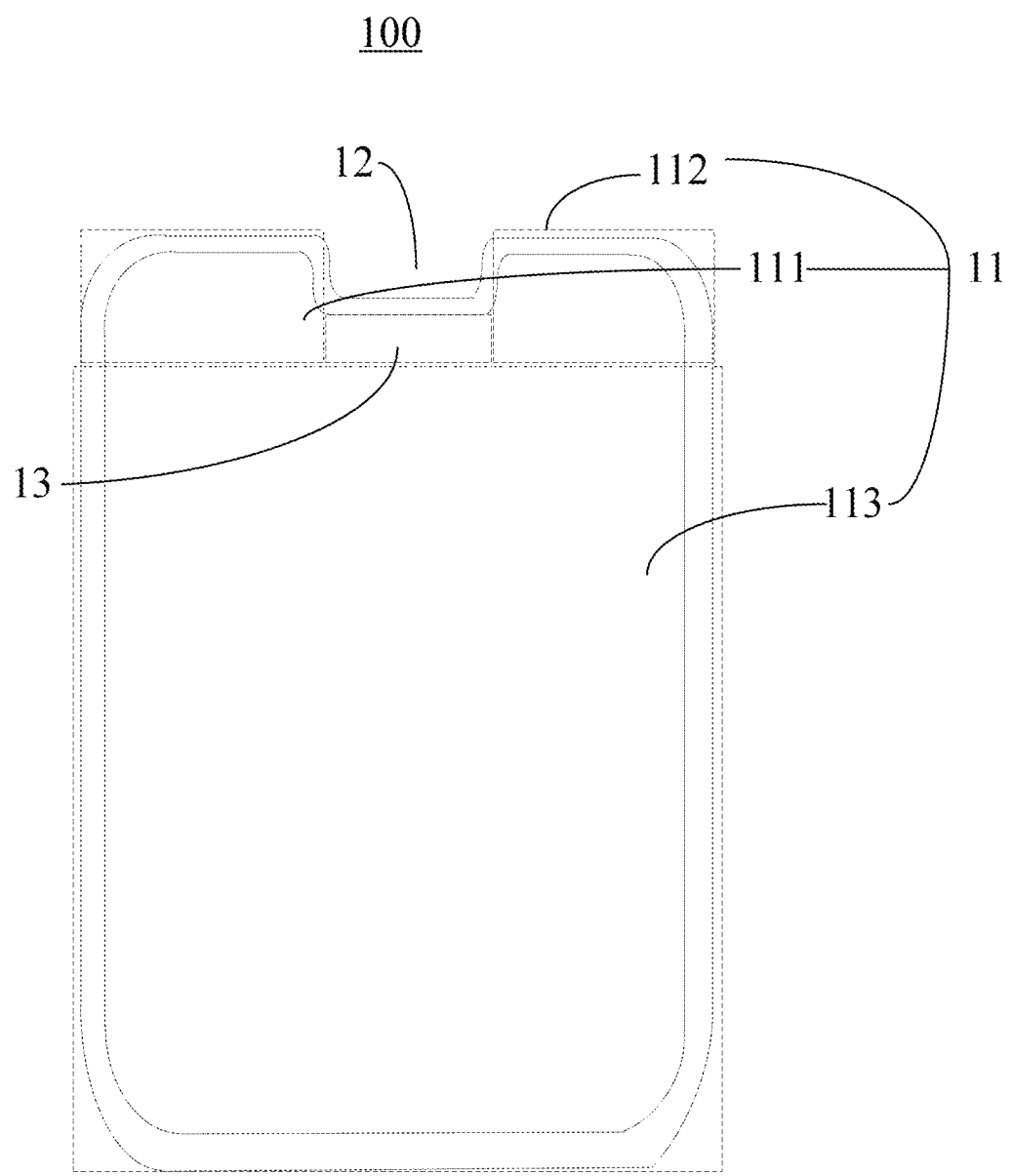
FIG. 1 illustrates a schematic view of a display panel according to some embodiments of the present disclosure.

In order to more clearly illustrate objectives, technical solutions, and advantages of the present disclosure, the embodiments of the present disclosure will be described detailly with reference to drawings. It should be understood that the following description of the embodiments is intended to explain and illustrate general idea of the present disclosure, rather than to limit the present disclosure. In specification and drawings, the same or similar reference numerals refer to the same or similar components or structures. For clarity, drawings are not necessarily drawn to scale, and some well-known components and structures may be omitted from drawings.

Unless otherwise defined, the technical terms or scientific terms in the present disclosure shall have the usual meanings understood by those skills in the art. The terms "first", "second" and similar words in the present disclosure do not indicate any order, quantity and importance, but are only used to distinguish different components. The terms "a" or "an" does not exclude a plurality. The terms "include", "comprise" and other similar words mean that an item appearing before the term covers items listed after the term, but does not exclude other items. The terms "connected" or "connected" are not limited to physical or mechanical connections, but may include electrical connections, whether direct or indirect. The terms "up", "down", "left", "right", "top" or "bottom", etc. are only used to indicate relative positional relationships, if an absolute position of described object changes, the relative position relationship may also change accordingly. When an element such as a layer, film, region, or substrate is referred to as being "on" or "under" another element, the element can be "directly" on or "under" the other element, or there may be intermediate elements.

In an actual display panel, for special-shaped screens with notches in a display area (such as "bangs" screens, etc.), some gate lines may need to pass through a non-display area for routing. Since there are no electrode patterns such as pixel units and data lines in the non-display area, a parasitic capacitance formed by a part of a gate line in the non-display area and an electrode pattern in a layer different from the gate line, is different from a parasitic capacitance formed by a part of a gate line in the display area and an electrode pattern in a layer different from the gate line. In this way, the parasitic capacitance of the gate line passing through the non-display area and the parasitic capacitance of the gate line passing through the display area have a significant difference. The difference may affect a display effect, for example, Mura and other defects may be generated. In order to compensate for the difference, a capacitance compensation unit may be arranged in the non-display area where the gate line passes, that is, a capacitance structure is formed by the gate line and other metal layer structures, and a value of a compensation capacitor is designed through theoretical simulation calculations. Therefore, the non-display area, in which the capacitance compensation unit is located and through which the gate line passes, may also be referred to as "capacitance compensation area".

FIG. 1 schematically illustrates a top view of a display panel 100 according to some embodiments of the present disclosure. The display panel 100 includes a display area 11, a notch area 12 and a capacitance compensation area 13. In the embodiment shown in FIG. 1, the notch area 12 is a notch structure, which is surrounded by a first display sub-area 111, a second display sub-area 112, and a third display sub-area 113 in the display area 11 from three sides, respectively. However, the embodiment of the present disclosure is not limited thereto, as long as the notch area 12 is at least partially surrounded by the display area 11. For example, the notch area 12 may also be a closed shape (such as a square hole, a round hole, etc.) surrounded by the display area. The notch area 12 may be configured, for example, to reserve design space for components such as a front camera. The capacitance compensation area 13 may be located on a side of the display area 11 facing the notch area 12. In the embodiment shown in FIG. 1, the capacitance compensation area 13 is located under the notch area 12. The display area 11, the notch area 12 and the capacitance compensation area 13 may all be arranged on a substrate 10 of the display panel 100.

Figure 2:
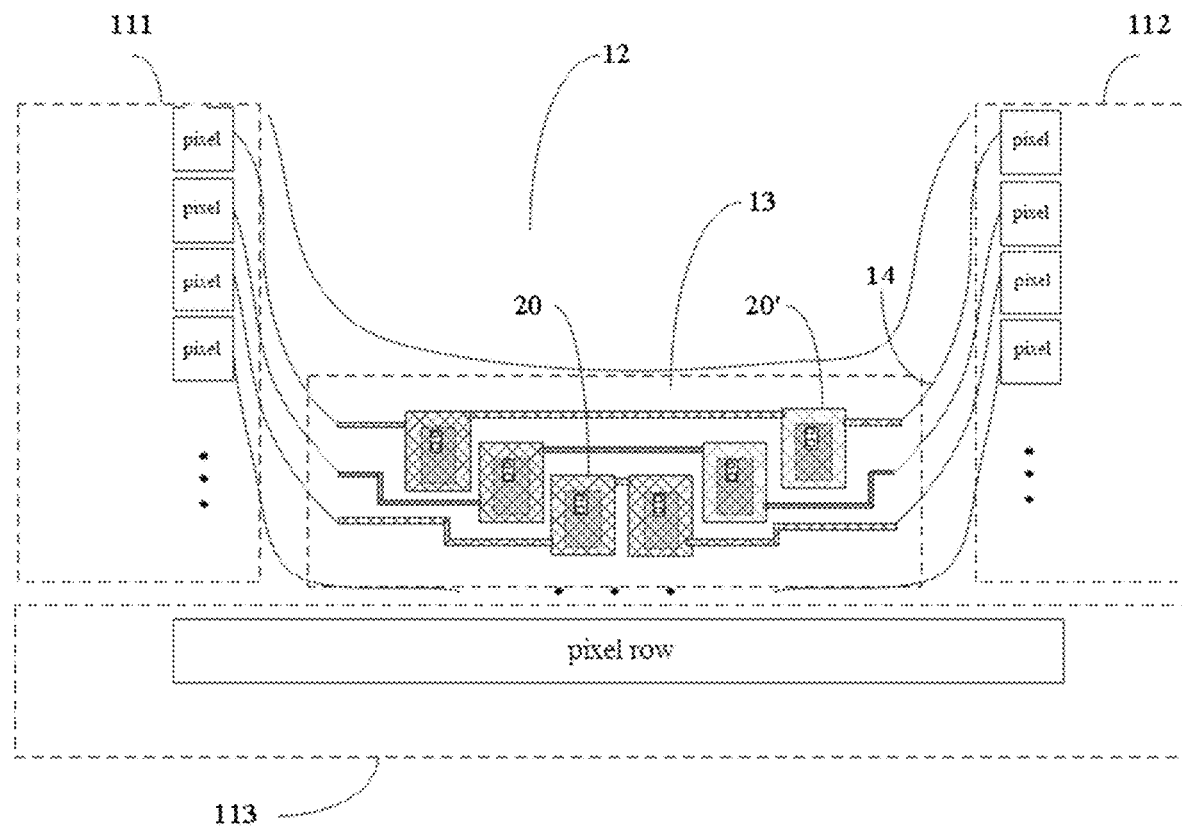
FIG. 2 illustrates a schematic structural view of a capacitance compensation area in the display panel according to some embodiments of the present disclosure.

FIG. 2 illustrates the capacitance compensation area 13 more clearly. For the embodiments shown in FIG. 1 and FIG. 2, the display area 11 includes the first display sub-area 111 and the second display sub-area 112 respectively located on different (e.g. opposite) sides of the notch area 12. In order to implement a display function of pixels in the first display sub-area 111 and the second display sub-area 112, a plurality of gate lines 14 may be arranged by extending from the first display sub-area 111 through the capacitance compensation area 13 to the second display sub-area 112. Each gate line 14 may be configured to connect a row of pixels. In order to perform capacitance compensation for each gate line 14, the capacitance compensation area 13 includes a plurality of capacitance compensation units 20, 20', 20". Each capacitance compensation unit of at least some of the plurality of capacitance compensation units 20, 20', 20" includes: a first conductive layer 21, a second conductive layer 22, and a first insulating layer 23 between the first conductive layer 21 and the second conductive layer 22. The first conductive layer 21 is electrically connected to one of the plurality of gate lines 14, and an orthographic projection of the second conductive layer 22 on the substrate 10 at least partially overlap with an orthographic projection of the first conductive layer 21 on the substrate 10. The first insulating layer 23 is configured to electrically insulate the first conductive layer 21 from the second conductive layer 22. In this way, a compensation capacitor is formed between an overlapping part of the first conductive layer 21 and the second conductive layer 22. FIGS. 1 and 2 also illustrate the third display sub-area 113. Since pixel rows in the third display sub-area 113 are not affected by the notch area 12, gate lines in the third display sub-area 113 is not necessary to pass through the capacitance compensation area 13 for capacitance compensation.

Figure 4A:
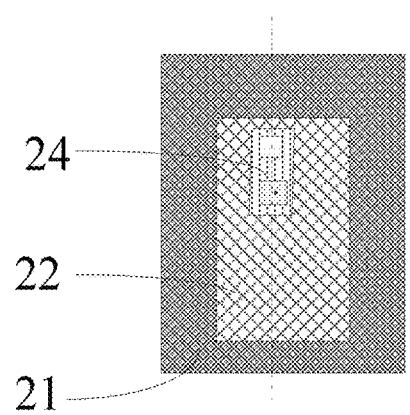
FIG. 4A illustrates a schematic top view of one capacitance compensation unit in the capacitance compensation area.
Figure 4B:
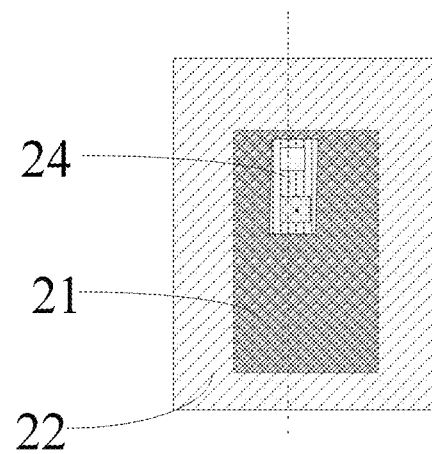
FIG. 4B illustrates another schematic top view of one capacitance compensation unit in the capacitance compensation area.
Figure 4C:
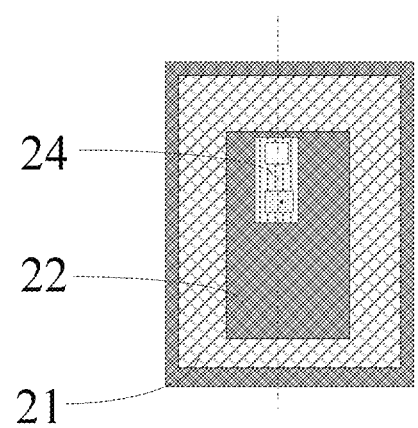
FIG. 4C illustrates yet another schematic top view of one capacitance compensation unit in the capacitance compensation area.

FIGS. 4A, 4B, and 4C respectively illustrate exemplary capacitance compensation units 20, 20', 20". For clarity, only the first conductive layer 21, the second conductive layer 22, and the fifth conductive layer 24 are shown in the top view, and other layer structures are shown in the corresponding cross-sectional views of FIGS. 5A, 5B, and 5C (cut along dashed lines in FIGS. 4A, 4B, and 4C, respectively). It can be seen from the examples of the capacitance compensation units 20, 20', 20" in FIGS. 4A, 4B, and 4C that the first conductive layer 21 and the second conductive layer 22 directly form the compensation capacitance. In each capacitance compensation unit 20, 20', 20", both the first conductive layer 21 and the second conductive layer 22 have a large area, so that the compensation capacitor in each capacitance compensation unit 20, 20', 20" is less affected by process fluctuations. In some embodiments, one insulating layer (i.e., the first insulating layer 23) may be provided between the first conductive layer 21 and the second conductive layer 22, and the compensation capacitor is determined by an overlapping area between the first conductive layer 21 and the second conductive layer 22. That is, the first conductive layer 21 and the second conductive layer 22 are separated by the first insulating layer 23. In this way, structures of the capacitance compensation units 20, 20', 20" are simplified, and other large-area layers (such as a polysilicon layer, etc.) on the display panel are not needed to form the compensation capacitance.

In some embodiments, in each capacitance compensation unit 20, 20', 20", the first conductive layer 21 and the second conductive layer 22 may each have a rectangular pattern. However, the embodiments of the present disclosure are not limited thereto, for example, the first conductive layer 21 and the second conductive layer 22 may also have patterns such as a circle, a pentagon, and a hexagon.

Figure 5A:
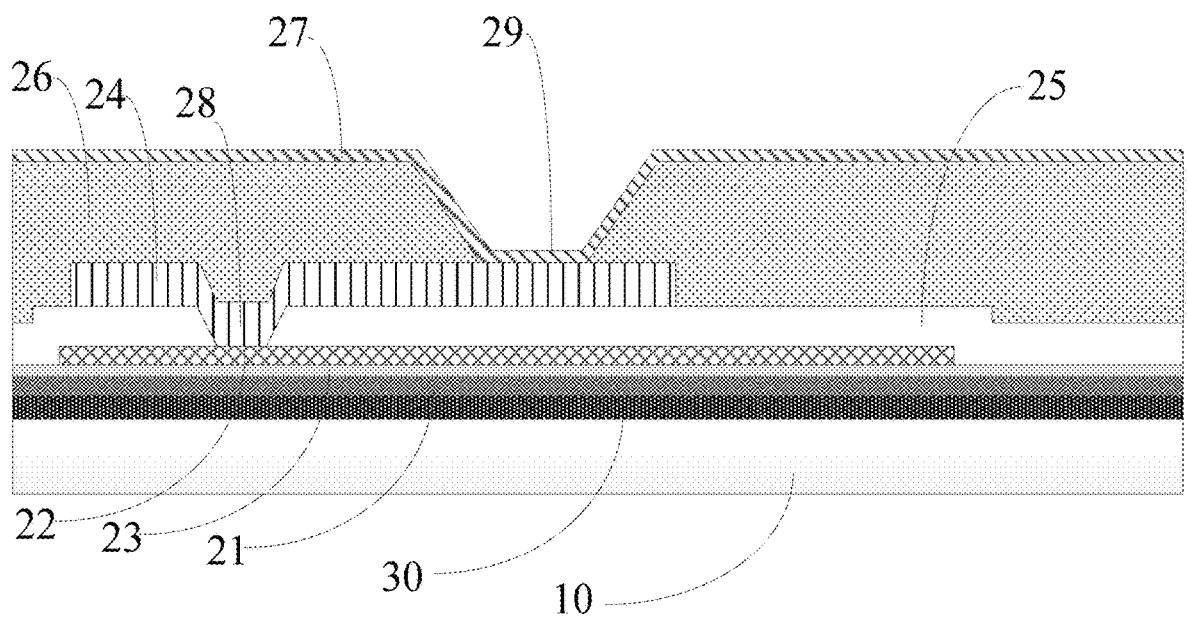
FIG. 5A illustrates a structure schematic cross-sectional view of one capacitance compensation unit in the capacitance compensation area.

Structures of exemplary capacitance compensation units 20, 20', 20" in the capacitance compensation area 13 are shown one by one in FIGS. 4A, 4B, 4C, and 5A, 5B, and 5C. As shown in FIGS. 4A and 5A, the capacitance compensation unit 20 further includes a fifth conductive layer 24 and a second insulating layer 25. The second conductive layer 22 may be located on a side of the first conductive layer 21 away from the substrate 10 (upper side in figure), and the second insulating layer 25 is located on the side of the second conductive layer 22 away from the first conductive layer 21 (upper side in figure), the fifth conductive layer 24 is located on the side of the second insulating layer 25 away from the first conductive layer 21 (upper side in figure). In some embodiments, the second insulating layer 25 is provided with a first via-hole structure 28, and the fifth conductive layer 24 is electrically connected to the second conductive layer 22 through the first via-hole structure 28. In some embodiments, the capacitance compensation unit 20 further includes: a third insulating layer 26 and a first electrode layer 27. The third insulating layer 26 is located on the side of the fifth conductive layer 24 away from the substrate 10 (upper side in figure), and the first electrode layer 27 is located on the third insulating layer 26 away from the substrate 10 (upper side in figure). The first electrode layer 27 is electrically connected to a DC signal (for example, a DC power signal or a common connection terminal signal VSS, etc.), a second via-hole structure 29 is provided in the third insulating layer 26, and the first electrode layer 27 is electrically connected to the fifth conductive layer 24 through the second via-hole structure 29. In this way, the second conductive layer 22 may be electrically connected to a DC signal, such as a DC power signal, a common connection terminal signal, or a level signal output by a certain circuit. The second conductive layer 22 may always be at a fixed potential, which is helpful for improving the stability and consistency of a potential of a gate line.

Figure 5B:
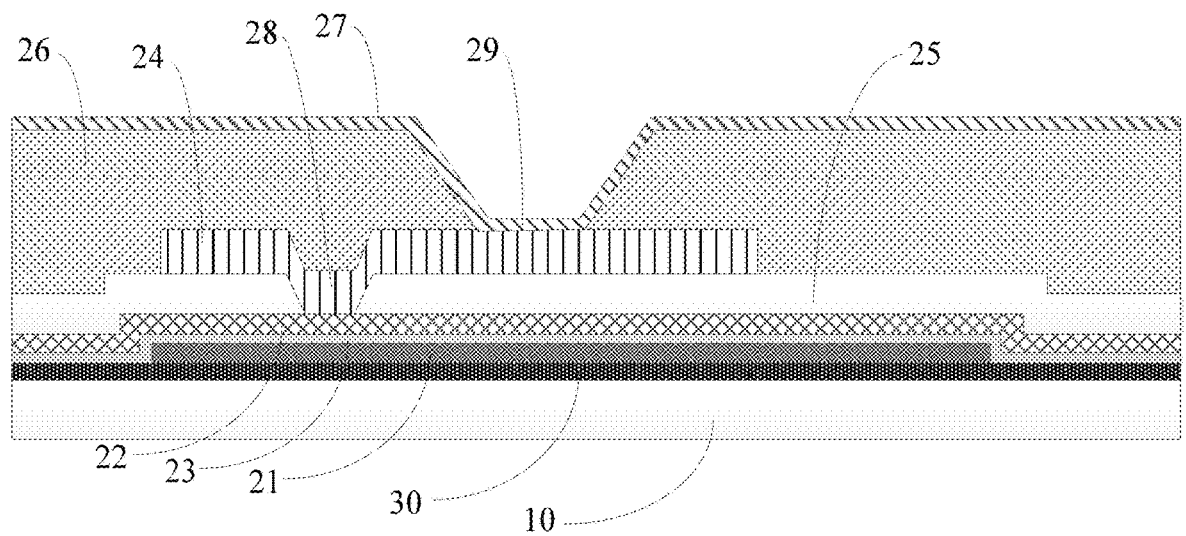
FIG. 5B illustrates another schematic cross-sectional view of one capacitance compensation unit in the capacitance compensation area.

The capacitance compensation unit 20' shown in FIGS. 4B and 5B and the capacitance compensation unit 20 shown in FIGS. 4A and 5A have a similar structure, but an area of the first conductive layer 21 and an area of the second conductive layer 22 are different. In the capacitance compensation unit 20 shown in FIGS. 4A and 5A, the area of the first conductive layer 21 is larger than the area of the second conductive layer 22, and in the capacitance compensation unit 20' shown in FIGS. 4B and 5B, the area of the first conductive layer 21 is smaller than the area of the second conductive layer 22.

Figure 5C:
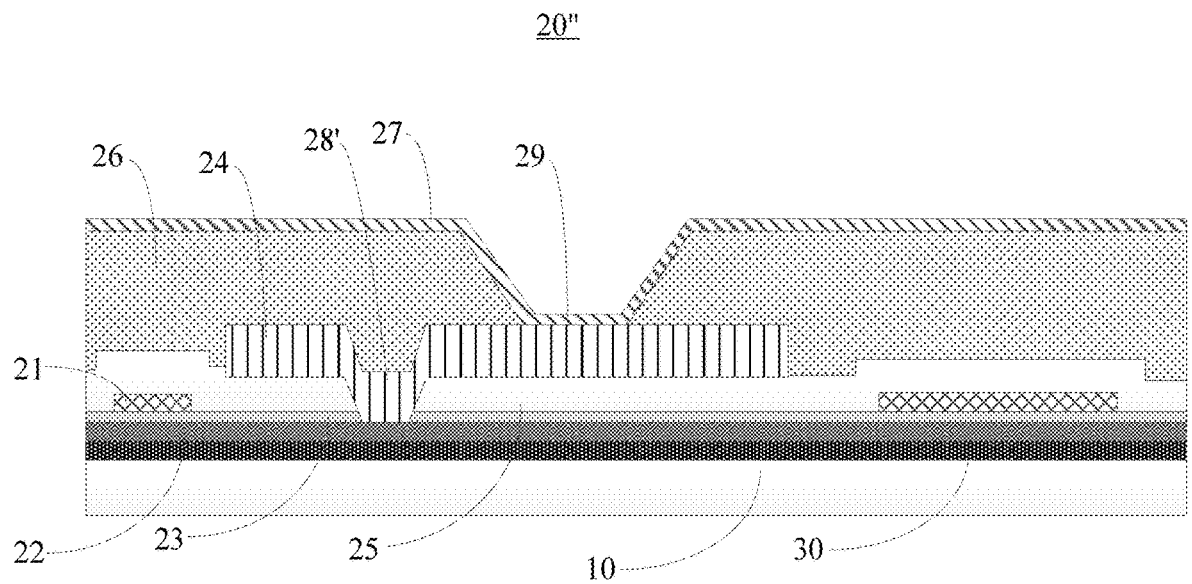
FIG. 5C illustrates another schematic cross-sectional view of one capacitance compensation unit in the capacitance compensation area.

FIGS. 4C and 5C illustrate another capacitance compensation unit 20". In the embodiment, the first conductive layer 21 is located on a side of the second conductive layer 22 away from the substrate 10 (upper side in figure), and each capacitance compensation unit 20" also includes a fifth conductive layer 24 and a second insulating layer 25. The second insulating layer 25 is located on the side of the first conductive layer 21 away from the second conductive layer 22 (upper side in figure), and the fifth conductive layer 24 is located on a side of the second insulating layer 25 away from the first conductive layer 21 (upper side in figure).

In some embodiments, the capacitance compensation area 13 is provided with a third via-hole structure 28' penetrating the first insulating layer 23 and the second insulating layer 25, the fifth conductive layer 24 is electrically connected to the second conductive layer 22 through the third via-hole structure 28', and the third via-hole structure 28' is electrically insulated from the first conductive layer 21. Compared with the capacitance compensation unit 20' shown in FIGS. 4B and 5B, the first conductive layer 21 in the capacitance compensation unit 20" shown in FIGS. 4C and 5C is electrically connected to a gate line, the first conductive layer 21 is farther away from the substrate than the second conductive layer 22. Therefore, the fifth conductive layer 24 must pass through the first conductive layer 21, and the fifth conductive layer 24 is electrically insulated from the first conductive layer 21 to achieve electrical connection with the second conductive layer 22. In order to implement this function, as an example, the first conductive layer 21 may be arranged in a ring pattern (for example, a rectangular ring pattern), as shown in FIG. 5C. However, this is merely illustrative, and the embodiments of the present disclosure are not limited thereto.

In some embodiments, the capacitance compensation unit 20" may also include: a third insulating layer 26 and a first electrode layer 27. The third insulating layer 26 is located on the side of the fifth conductive layer 24 away from the substrate 10 (upper side in figure), the first electrode layer 27 is located on the side of the third insulating layer 26 away from the substrate 10 (upper side in figure). The first electrode layer 27 is electrically connected to a DC signal, the third insulating layer 26 is provided with a second via-hole structure 29, and the first electrode layer 27 is electrically connected to the fifth conductive layer 24 through the second via-hole structure 29. Similar to before embodiments, in this way, the second conductive layer 22 can be electrically connected to a DC signal, such as a DC power signal or a level signal output by a certain circuit. The second conductive layer 22 may always be at a fixed potential, which is beneficial to improve the stability and consistency of a potential of a gate line.

In some embodiments, the first electrode layer 27 may be, for example, an anode layer, and the third insulating layer 26 may be, for example, a planarization layer.

In some embodiments, in the capacitance compensation units 20, 20', and 20", a fifth insulating layer 30 may be provided between one of the first conductive layer 21 and the second conductive layer 22 closer to the substrate 10.

In some embodiments of the capacitance compensation unit, the second conductive layer 22 may have a rectangular pattern, and the first conductive layer 21 may have a rectangular pattern or a ring pattern. However, this is only exemplary, and the embodiments of the present disclosure are not limited thereto.

In some embodiments of the capacitance compensation unit (for example, in the capacitance compensation unit 20 shown in FIG. 4A and FIG. 5A), the area of the first conductive layer 21 is larger than the area of the second conductive layer 22, and the orthographic projection of the first conductive layer 21 on the substrate 10 completely covers the orthographic projection of the second conductive layer 22 on the substrate 10. In this case, the compensation capacitor of the capacitance compensation unit is mainly determined by the area of the second conductive layer 22. Therefore, in practice, the size of the compensation capacitor may be adjusted by changing the area of the second conductive layer 22 in the capacitance compensation unit.

In other embodiments of the capacitance compensation unit (for example, in the capacitance compensation unit 20' shown in FIGS. 4B and 5B and in the capacitance compensation unit 20" shown in FIGS. 4C and 5C), the area of the first conductive layer 21 is smaller than the area of the second conductive layer 22 and the orthographic projection of the second conductive layer 22 on the substrate 10 completely covers the orthographic projection of the first conductive layer 21 on the substrate 10. In this case, the compensation capacitor of the capacitance compensation unit is mainly determined by the area of the first conductive layer 21. Therefore, in practice, the size of the compensation capacitor may be adjusted by changing the area of the first conductive layer 21 in the capacitance compensation unit. In the embodiments of the present disclosure, in the same capacitance compensation unit, the area of the first conductive layer 21 may also be equal to the area of the second conductive layer 22.

Figure 8:
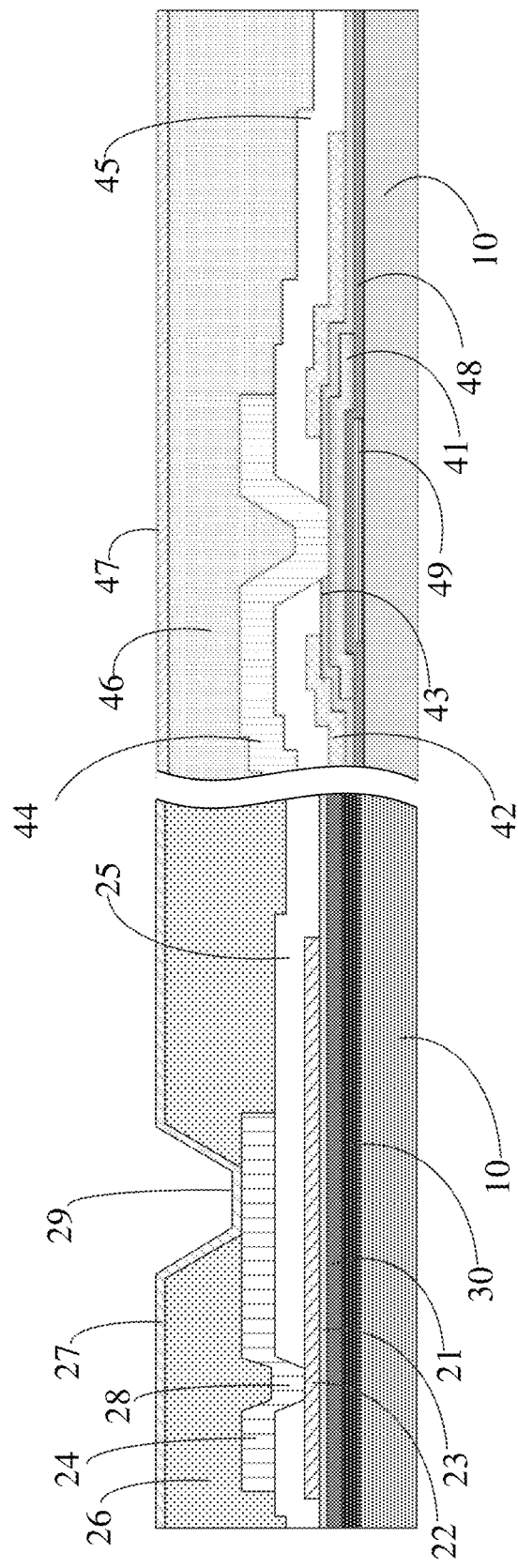
FIG. 8 illustrates a structural schematic cross-sectional view of a display panel according to some embodiments of the present disclosure.
Figure 9:
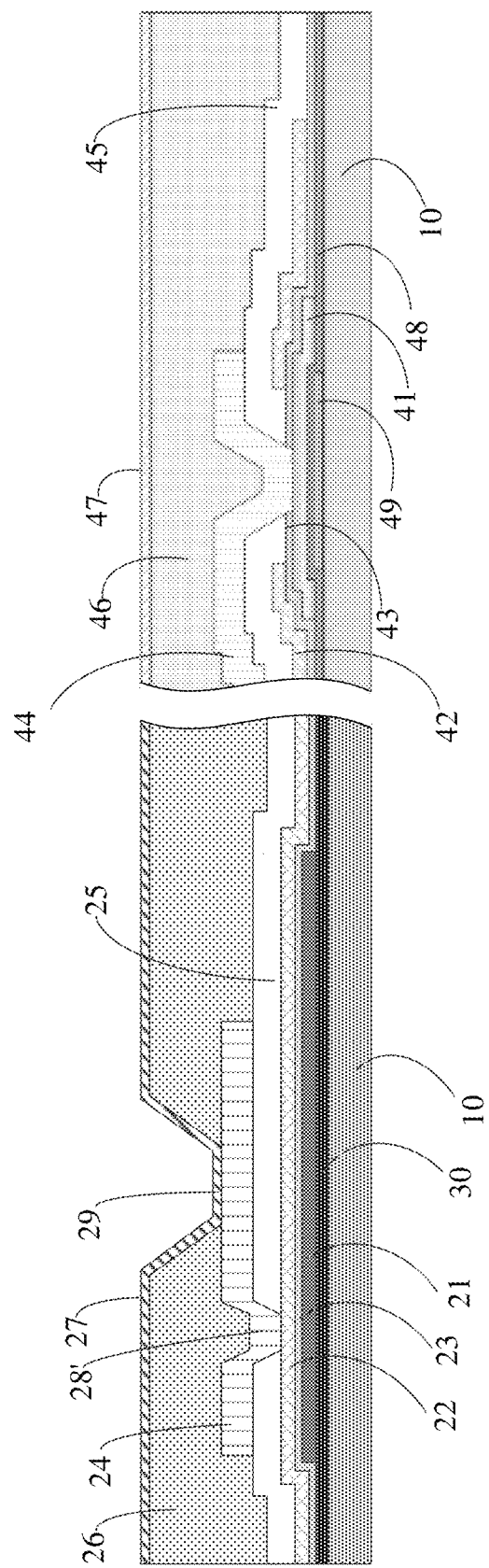
FIG. 9 illustrates another structural schematic cross-sectional view of a display panel according to some embodiments of the present disclosure.
Figure 10:
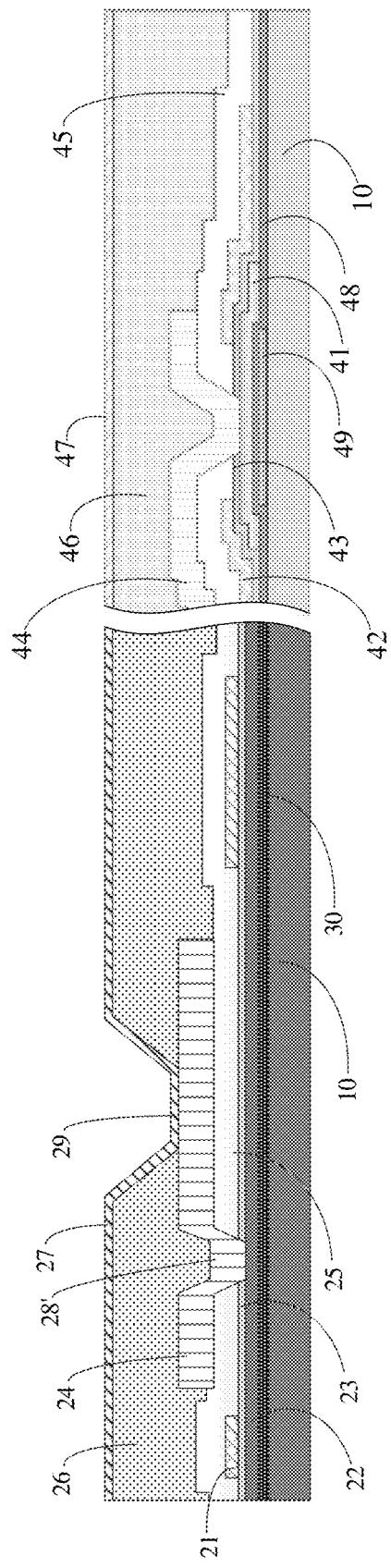
FIG. 10 illustrates another structural schematic cross-sectional view of a display panel according to some embodiments of the present disclosure.

In some embodiments, the first conductive layer 21 and the second conductive layer 22 in the capacitance compensation unit 20, 20', 20" may be provided in the same layer as some structures in the display area 11. This could simplify process as much as possible. For example, a thin film transistor (for example, a thin film transistor in a driving circuit of a pixel unit) may be arranged in the display area 11, and the thin film transistor may include a gate electrode (for example, also include source, drain, etc.). The display area 11 may include: a third conductive layer 41 and a fourth conductive layer 42. For example, the third conductive layer 41 may be configured to form the gate electrode of the thin film transistor, an orthographic projection of the fourth conductive layer 42 on the substrate 10 and an orthographic projection of the third conductive layer 41 on the substrate 10 at least partially overlap to form a capacitor. As shown in FIGS. 8-10, one of the first conductive layer 21 and the second conductive layer 22 in the capacitance compensation area 13 is provided in a layer same as a layer where the third conductive layer 41 in the display area 11 is provided, another of the first conductive layer 21 and the second conductive layer 22 is provided in a layer same as a layer where the fourth conductive layer 42 in the display area 11 is provided. Correspondingly, the first insulating layer 23 in the capacitance compensation area 13 and the fourth insulating layer 43 between the third conductive layer 41 and the fourth conductive layer 42 in the display area 11 may be provided in the same layer. The foregoing is merely exemplary, and the embodiments of the present disclosure are not limited thereto. For example, the third conductive layer 41 in the display area 11 may also be a conductive layer for forming a structure other than the gate electrode.

The term "provided in the same layer" in the present disclosure means that the involved layers are formed at the same time in the same process step, but it does not mean that layers must have the same thickness or height in a cross-sectional view. Structures "provided in the same layer" can simplify manufacturing process of the display panel.

Figure 6:
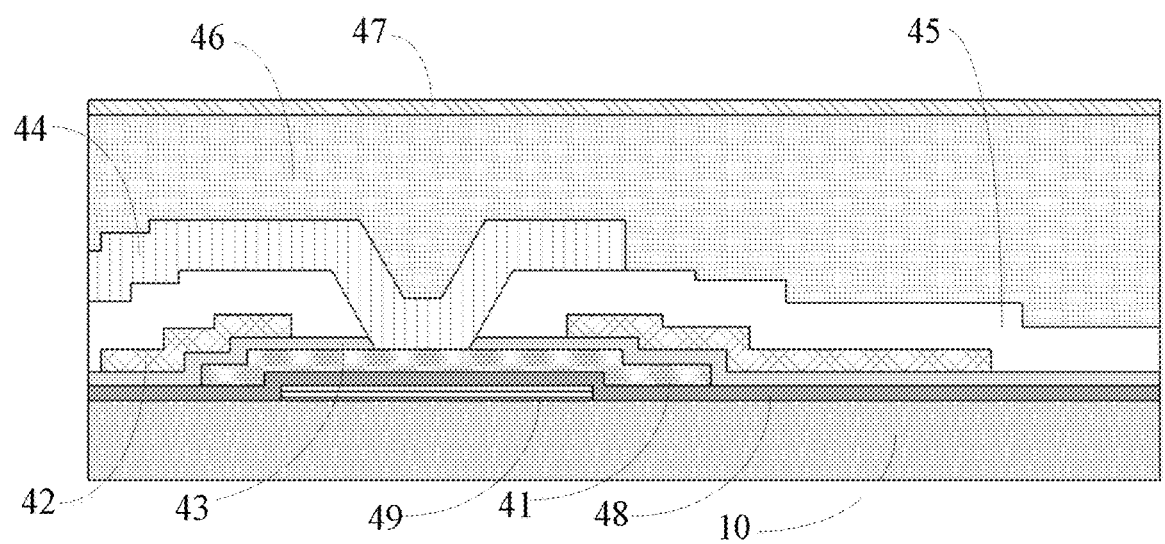
FIG. 6 schematically illustrates an example of a structure corresponding to each structure layer of a capacitance compensation unit in a display area of the display panel according to some embodiments of the present disclosure.

If the third conductive layer 41 is closer to the substrate 10 than the fourth conductive layer 42 in the display area 11, as shown in FIG. 6 and FIG. 8, for the capacitance compensation unit 20 shown in FIGS. 4A and 5A, the first conductive layer 21 may be provided in the same layer as the third conductive layer 41 in the display area 11, the second conductive layer 22 may be provided in the same layer as the fourth conductive layer 42 in the display area 11. As mentioned before, in a case where the area of the first conductive layer 21 is greater than the area of the second conductive layer 22 and the orthographic projection of the first conductive layer 21 on the substrate 10 completely covers the orthographic projection of the second conductive layer 22 on the substrate 10, the size of the compensation capacitor in the capacitance compensation unit 20 may be adjusted by changing the area of the second conductive layer 22. In practice, the area of the second conductive layer 22 may be changed by adjusting an etching rate of the second conductive layer 22.

Similarly, if the third conductive layer 41 is closer to the substrate 10 than the fourth conductive layer 42 in the display area 11, for the capacitance compensation unit 20' shown in FIGS. 4B and 5B, as shown in FIG. 9, the first conductive layer 21 may be provided in the same layer as the third conductive layer 41 in the display area 11, the second conductive layer 22 may be provided in the same layer as the fourth conductive layer 42 in the display area 11. As mentioned before, in a case where the area of the first conductive layer 21 is smaller than the area of the second conductive layer 22 and the orthographic projection of the second conductive layer 22 on the substrate 10 completely covers the orthographic projection of the first conductive layer 21 on the substrate 10, the size of the compensation capacitor in the capacitance compensation unit 20' may be adjusted by changing the area of the first conductive layer 21. In practice, the area of the first conductive layer 21 may be changed by adjusting an etching rate of the first conductive layer 21. For example, for different gate lines, different compensation capacitances may be applied. However, the embodiments of the present disclosure are not limited to this. For example, for different gate lines, different compensation capacitances may also be applied.

However, considering that the first conductive layer 21 and the third conductive layer 41 in the display area 11 are provided in the same layer, therefore, in manufacturing process, once the etching rate of the first conductive layer 21 is changed, an etching rate of the third conductive layer 41 in the display area 11 will also be changed accordingly. For example, when the third conductive layer 41 is configured to form a thin film transistor in a driving circuit of a pixel unit, the etching rate of the third conductive layer 41 may be a relatively sensitive parameter, or tolerance of process is small. If the etching rate of the third conductive layer 41 varies greatly, a performance of the driving circuit in the display area 11 may be affected. Therefore, the etching rate of the third conductive layer 41 is usually not adjusted. In contrast, a process tolerance of an etching rate of the fourth conductive layer 42 is greater than a process tolerance of the etching rate of the third conductive layer 41. Therefore, in this case, for the capacitance compensation unit 20 shown in FIGS. 4A and 5A, an adjustment range of the compensation capacitor of the capacitance compensation unit 20 is larger than an adjustment range of the compensation capacitor of the capacitance compensation unit 20' shown in FIGS. 4B and 5B.

For the capacitance compensation unit 20" shown in FIGS. 4C and 5C, if the third conductive layer 41 is closer to the substrate 10 than the fourth conductive layer 42 in the display area 11, as shown in FIG. 10, the first conductive layer 21 may be provided in the same layer as the fourth conductive layer 42 in the display area 11, and the second conductive layer 22 may be provided in the same layer as the third conductive layer 41 in the display area 11. As mentioned before, in the case where the area of the first conductive layer 21 is smaller than the area of the second conductive layer 22 and the orthographic projection of the second conductive layer 22 on the substrate 10 completely covers the area of the first conductive layer 21 on the substrate 10, the size of the compensation capacitor in the capacitance compensation unit 20" may be adjusted by changing the area of the first conductive layer 21. In practice, the area of the first conductive layer 21 may also be changed by adjusting the etching rate of the first conductive layer 21. However, in the capacitance compensation unit 20" shown in FIGS. 4C and 5C, the first conductive layer 21 has a rectangular ring pattern. Compared with the first conductive layer 21 having a rectangular pattern (for example, in the capacitance compensation unit 20 shown in FIGS. 4A and 5A), more pattern boundaries of the first conductive layer 21 (not only outer peripheral boundary but also inner peripheral boundary), more difficult it is to control the area size of the first conductive layer 21 by adjusting the etching rate of the first conductive layer 21. Therefore, regarding difficulty of adjusting the size of the compensation capacitor in the capacitance compensation unit 20, the capacitance compensation unit 20 shown in FIGS. 4A and 5A has a better effect than the capacitance compensation unit 20' shown in FIGS. 4B and 5B and the capacitance compensation unit 20" shown in FIGS. 4C and 5C.

FIG. 6 also schematically illustrates other layers that may exist in the display area 11 in addition to the third conductive layer 41 and the fourth conductive layer 42, including: a first gate electrode insulating layer 48, source and drain layers 44, an interlayer dielectric layer 45, a planarization layer 46, an anode layer 47, a second gate electrode insulating layer 43, and an active layer 49. In some embodiments, the first insulating layer 23 in the capacitance compensation area 13 may be provided in the same layer as the second gate electrode insulating layer 43 in the display area 11; the second insulating layer 25 in the capacitance compensation area 13 may be provided in the same layer as the interlayer dielectric layer 45 in the display area 11; the fifth conductive layer 24 in the capacitance compensation area 13 may be provided in the same layer as the source and drain layer 44 in the display area 11; the third insulating layer 26 in the capacitance compensation area 13 may be provided in the same layer as the planarization layer 46 in the display area 11; the first electrode layer 27 in the capacitance compensation area 13 may be provided in the same layer as the anode layer 47 in the display area 11. Therefore, a manufacturing process of the display panel may be simplified as much as possible.

Figure 3A:
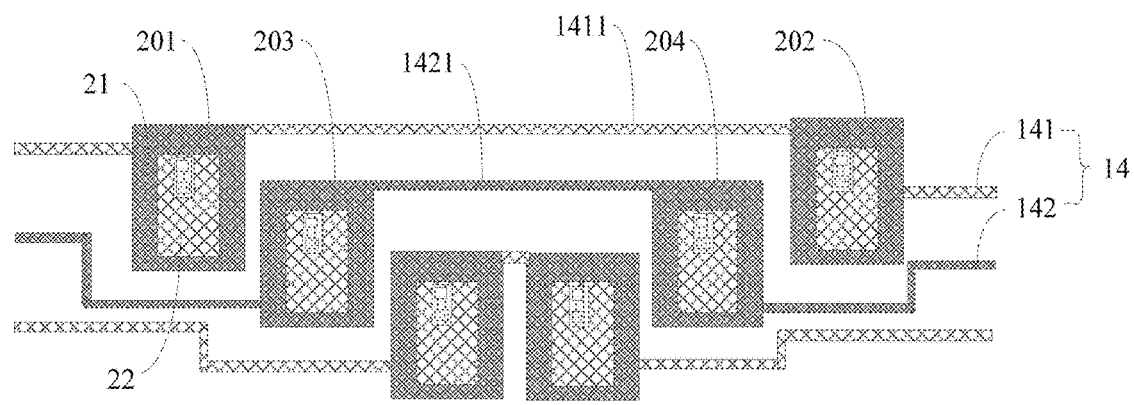
FIG. 3A illustrates a schematic view of an exemplary arrangement of capacitance compensation units in the capacitance compensation area.
Figure 3B:
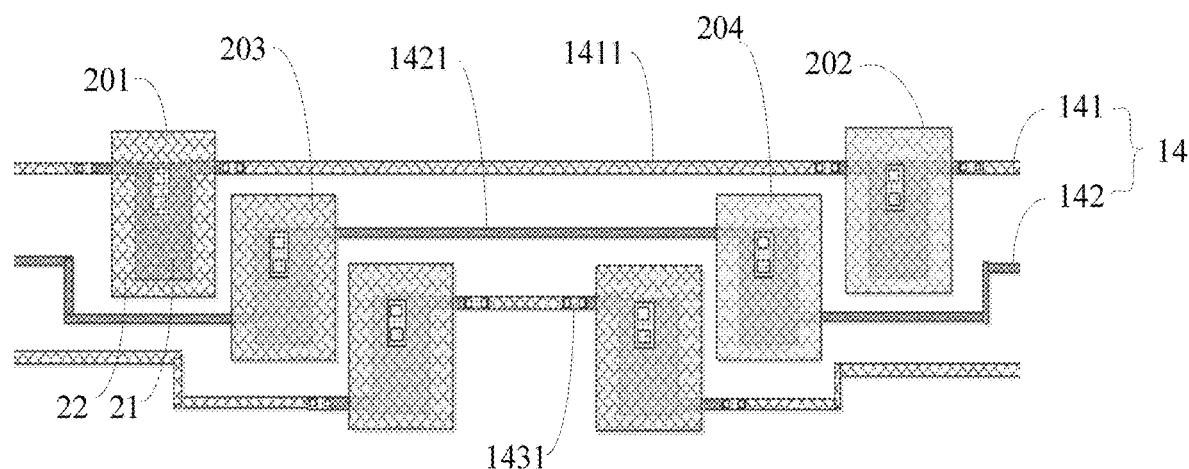
FIG. 3B illustrates a schematic view of another exemplary arrangement of capacitance compensation units in the capacitance compensation area.

In some embodiments, as shown in FIGS. 3A and 3B, the plurality of capacitance compensation units may include: a first capacitance compensation unit 201 and a second capacitance compensation unit 202 connected to a first gate line 141; and a third capacitance compensation unit 203 and a fourth capacitance compensation unit 204 connected to a second gate line 142. The first gate line 141 and the second gate line 142 are adjacent to each other, and at least a part of the first gate line 141 in the capacitance compensation area 13 and at least a part of the second gate line 142 in the capacitance compensation area 13 are respectively provided in different layers. In other words, not all of adjacent gate lines in the capacitance compensation area 13 are provided in the same layer. In this way, parts of the first gate line 141 and the second gate line 142 in the capacitance compensation area 13 may be arranged more compactly, thereby reducing an area occupied by the capacitance compensation area 13 on the display panel.

In some embodiments, at least a part of the first gate line 141 in the capacitance compensation area 13 (for example, a connection line 1411) is provided in the same layer as the second conductive layer 22, and at least a part of the second gate line 142 in the capacitance compensation area 13 (for example, a connection line 1421) is provided in the same layer as the first conductive layer 21. In this way, existing conductive layer is configured for wiring to optimize a space of the capacitance compensation area 13.

In some embodiments, for example, as shown in FIG. 3B, a transition connection portion 1431 may also be provided in the gate line 14 (for example, the first gate line 141, the second gate line 142 or other gate lines), the transition connection portion 1431 is configured to connect parts of the gate line 14 in different layers (or with the first conductive layer or the second conductive layer in the capacitance compensation unit). As an example, when a first part of a certain gate line 14 in the capacitance compensation area 13 is provided in the same layer as the first conductive layer 21 and when a second part of the gate line 14 in the capacitance compensation area 13 is provided in the same layer as the second conductive layer 22, the transition portion 1431 may be provided in the same layer as another conductive layer (for example, the fifth conductive layer 24) except the first conductive layer 21 and the second conductive layer 22. The transition connection portion 1431 and the gate line 14 may be electrically connected between the first portion and the second portion in the capacitance compensation region 13 through via-hole structures or conductive holes. However, above is only exemplary, and the embodiments of the present disclosure are not limited thereto.

In addition, in the example shown in FIG. 3A, when the wiring 1411 of the gate line 14 and the first conductive layer 21 of the capacitance compensation unit are not in the same layer, the wiring 1411 of the gate line 14 and the first conductive layer 21 of the capacitance compensation unit may also be electrically connected through via-hole structures or conductive holes. The specific content will not be repeated.

Each conductive layer in the embodiments of the present disclosure may be made of conductive metal or non-metallic conductive material.

The display panel in the embodiments of the present disclosure may be, for example, an organic light-emitting diode (OLED) display panel, or may be any other display panel known in the art.

Figure 7:
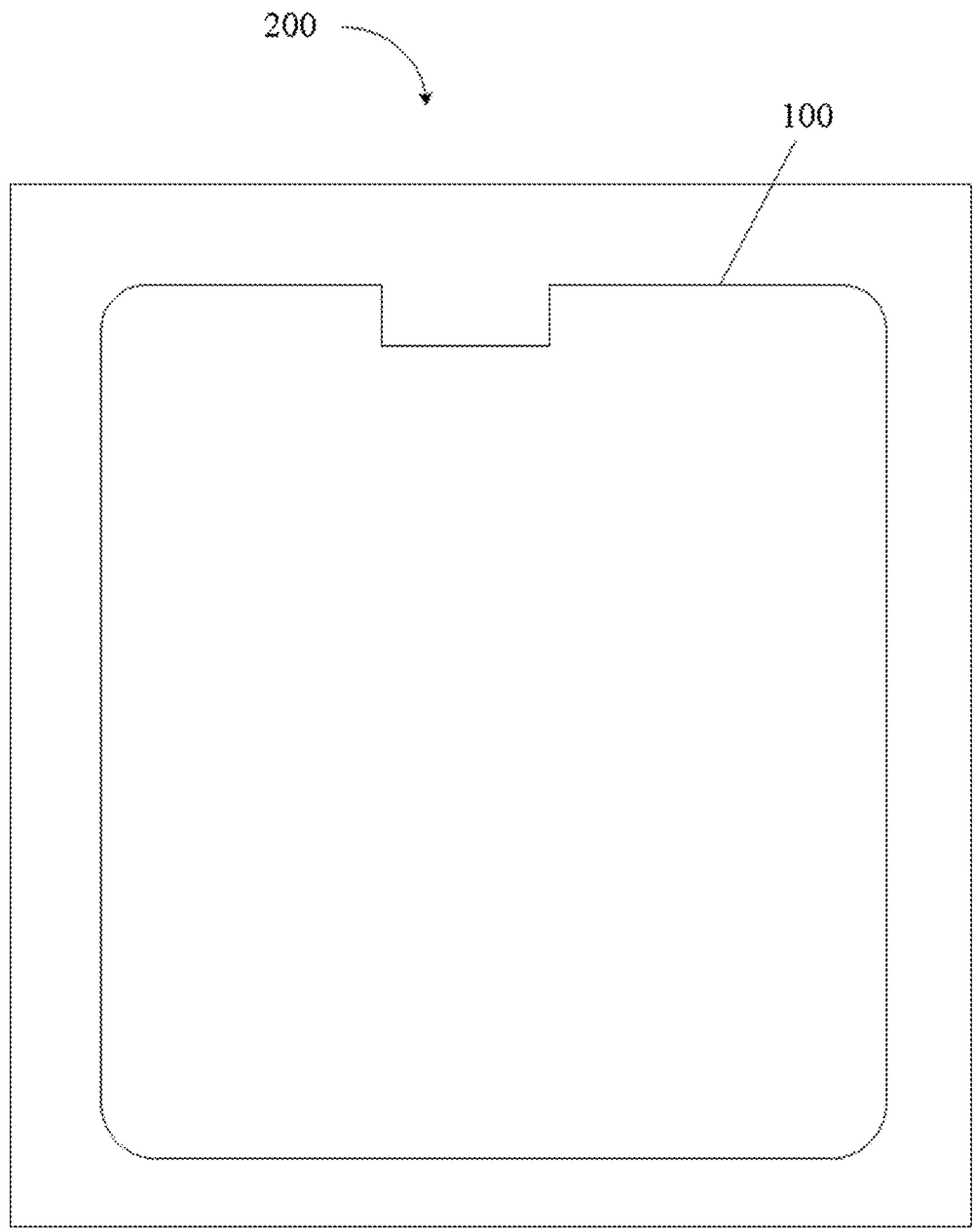
FIG. 7 schematically illustrates a schematic diagram of an electronic device including a display panel according to some embodiments of the present disclosure.

The embodiments of the present disclosure also provide an electronic device 200. As shown in FIG. 7, the electronic device 200 includes the display panel 100 according to any one of the above-mentioned embodiments. The electronic device may be, for example, any display device, such as a smart phone, a wearable smart watch, smart glasses, a tablet computer, a television, a monitor, a notebook computer, a digital photo frame, a navigator, a car monitor, an e-book, and the like.

Although the present disclosure has been described with reference to drawings, the embodiments disclosed in drawings are intended to exemplify the embodiments of the present disclosure and should not be understood as a limitation of the present disclosure. Size ratios in drawings are only schematic and should not be construed as limiting the present disclosure.

The above-mentioned embodiments only exemplarily illustrate principles and structures of the present disclosure but are not used to limit the present disclosure. Those skilled in the art should understand that without departing from a general idea of the present disclosure, any changes and improvements made to the present disclosure are within the scope of the present disclosure. The protection scope of the present disclosure shall be subject to the scope defined by claims of the present disclosure.

What is claimed is:
1. A display panel comprising:
a substrate;
a display area and a notch area on the substrate, wherein the display area at least partially surrounds the notch area; and
a capacitance compensation area, wherein the capacitance compensation area is located on a side of the display area facing the notch area,
wherein the capacitance compensation area comprises a plurality of capacitance compensation units, and each capacitance compensation unit of at least some of the plurality of capacitance compensation units comprises:
a first conductive layer, wherein the first conductive layer is electrically connected to one of a plurality of gate lines;
a second conductive layer, wherein an orthographic projection of the second conductive layer on the substrate at least partially overlaps with an orthographic projection of the first conductive layer on the substrate; and
a first insulating layer between the first conductive layer and the second conductive layer, wherein the first insulating layer is configured to electrically insulate the first conductive layer from the second conductive layer, wherein the second conductive layer is located on a side of the first conductive layer away from the substrate, and each capacitance compensation unit further comprises:
a second insulating layer, wherein the second insulating layer is located on a side of the second conductive layer away from the first conductive layer; and a fifth conductive layer, wherein the fifth conductive layer is located on a side of the second insulating layer away from the first conductive layer;
wherein a first via-hole structure is provided in the second insulating layer, and the fifth conductive layer is electrically connected to the second conductive layer through the first via-hole structure;
wherein each capacitance compensation unit further comprises:
a third insulating layer, wherein the third insulating layer is located on a side of the fifth conductive layer away from the substrate; and
a first electrode layer, wherein the first electrode layer is located on a side of the third insulating layer away from the substrate, and the first electrode layer is electrically connected to a DC signal; and
wherein a second via-hole structure is provided in the third insulating layer, and the first electrode layer is electrically connected to the fifth conductive layer through the second via-hole structure.

2. The display panel of claim 1, wherein the display area comprises:
a first display sub-area and a second display sub-area which are respectively located on different sides of the notch area,
wherein the plurality of gate lines extend from the first display sub-area through the capacitance compensation area to the second display sub-area.

3. The display panel of claim 1, wherein the first conductive layer and the second conductive layer are separated by only the first insulating layer.

4. The display panel of claim 1, wherein a thin film transistor is arranged in the display area, and the thin film transistor comprises a gate electrode;
the display area comprising:
a third conductive layer, wherein the third conductive layer is configured to form the gate electrode of the thin film transistor; and
a fourth conductive layer, wherein an orthographic projection of the fourth conductive layer on the substrate and an orthographic projection of the third conductive layer on the substrate at least partially overlap to form a capacitor,
wherein one of the first conductive layer and the second conductive layer is arranged in the same layer as the third conductive layer, and the other one of the first conductive layer and the second conductive layer is arranged in the same layer as the fourth conductive layer.

5. The display panel of claim 1, wherein, in the same one capacitance compensation unit, both the first conductive layer and the second conductive layer have a rectangular pattern.

6. The display panel according to claim 1, wherein, in the same one capacitance compensation unit, an area of the first conductive layer is larger than an area of the second conductive layer, and an orthographic projection of the first conductive layer on the substrate completely covers an orthographic projection of the second conductive layer on the substrate.

7. The display panel according to claim 1, wherein in the same one capacitance compensation unit, an area of the first conductive layer is smaller than an area of the second conductive layer, and an orthographic projection of the second conductive layer on the substrate completely covers an orthographic projection of the first conductive layer on the substrate.

8. The display panel according to claim 1, wherein the plurality of capacitance compensation units comprises:
a first capacitance compensation unit and a second capacitance compensation unit connected to a first gate line; and
a third capacitance compensation unit and a fourth capacitance compensation unit connected to a second gate line,
wherein the first gate line and the second gate line are adjacent to each other, and at least a part of the first gate line in the capacitance compensation area and at least a part of the second gate line in the capacitance compensation area are respectively provided in different layers.

9. An electronic device comprising the display panel according to claim 1.

10. The display panel of claim 2, wherein the first conductive layer and the second conductive layer are separated by only the first insulating layer.

11. The display panel of claim 2, wherein a thin film transistor is arranged in the display area, and the thin film transistor comprises a gate electrode;
the display area comprising:
a third conductive layer, wherein the third conductive layer is configured to form the gate electrode of the thin film transistor; and
a fourth conductive layer, wherein an orthographic projection of the fourth conductive layer on the substrate and an orthographic projection of the third conductive layer on the substrate at least partially overlap to form a capacitor,
wherein one of the first conductive layer and the second conductive layer is arranged in the same layer as the third conductive layer, and the other one of the first conductive layer and the second conductive layer is arranged in the same layer as the fourth conductive layer.

12. The display panel of claim 2, wherein the second conductive layer is located on a side of the first conductive layer away from the substrate, and each capacitance compensation unit further comprises:
a second insulating layer, wherein the second insulating layer is located on a side of the second conductive layer away from the first conductive layer; and
a fifth conductive layer, wherein the fifth conductive layer is located on a side of the second insulating layer away from the first conductive layer.

13. A display panel comprising:
a substrate;
a display area and a notch area on the substrate, wherein the display area at least partially surrounds the notch area; and
a capacitance compensation area, wherein the capacitance compensation area is located on a side of the display area facing the notch area,
wherein the capacitance compensation area comprises a plurality of capacitance compensation units, and each capacitance compensation unit of at least some of the plurality of capacitance compensation units comprises:
a first conductive layer, wherein the first conductive layer is electrically connected to one of a plurality of gate lines;
a second conductive layer, wherein an orthographic projection of the second conductive layer on the substrate at least partially overlaps with an orthographic projection of the first conductive layer on the substrate; and a first insulating layer between the first conductive layer and the second conductive layer, wherein the first insulating layer is configured to electrically insulate the first conductive layer from the second conductive layer;

wherein the first conductive layer is located on a side of the second conductive layer away from the substrate, and each capacitance compensation unit further comprises:
- a second insulating layer, wherein the second insulating layer is located on a side of the first conductive layer away from the second conductive layer; and
- a fifth conductive layer, wherein the fifth conductive layer is located on a side of the second insulating layer away from the first conductive layer;

wherein a third via-hole structure passing through both the first insulating layer and the second insulating layer is provided in the capacitance compensation area, the fifth conductive layer is electrically connected to the second conductive layer through the third via-hole structure, and the third via-hole structure is electrically insulated from the first conductive layer;

wherein each capacitance compensation unit further comprises:
- the third insulating layer, wherein the third insulating layer is located on a side of the fifth conductive layer away from the substrate; and
- the first electrode layer, wherein the first electrode layer is located on a side of the third insulating layer away from the substrate, and the first electrode layer is electrically connected to a DC signal; and wherein the second via-hole structure is provided in the third insulating layer, and the first electrode layer is electrically connected to the fifth conductive layer through the second via-hole structure.

14. The display panel of claim 13, wherein, in the same one capacitance compensation unit, the second conductive layer has a rectangular pattern, and the first conductive layer has a rectangular pattern or a ring pattern.

* * * * *